United States Patent
Torimi et al.

(10) Patent No.: US 10,665,485 B2
(45) Date of Patent: May 26, 2020

(54) HEAT TREATMENT VESSEL FOR SINGLE-CRYSTAL SILICON CARBIDE SUBSTRATE AND ETCHING METHOD

(71) Applicant: Toyo Tanso Co., Ltd., Osaka-shi, Osaka (JP)

(72) Inventors: Satoshi Torimi, Kanonji (JP); Masato Shinohara, Kanonji (JP); Norihito Yabuki, Kanonji (JP); Satoru Nogami, Kanonji (JP)

(73) Assignee: TOYO TANSO CO., LTD., Osaka-shi (JP)

( * ) Notice: Subject to any disclaimer, the term of this patent is extended or adjusted under 35 U.S.C. 154(b) by 0 days.

(21) Appl. No.: 15/766,191

(22) PCT Filed: Oct. 6, 2016

(86) PCT No.: PCT/JP2016/004505
§ 371 (c)(1),
(2) Date: Apr. 5, 2018

(87) PCT Pub. No.: WO2017/061122
PCT Pub. Date: Apr. 13, 2017

(65) Prior Publication Data
US 2018/0301359 A1    Oct. 18, 2018

(30) Foreign Application Priority Data
Oct. 6, 2015 (JP) ................. 2015-198143

(51) Int. Cl.
*H01L 21/683* (2006.01)
*H01L 21/67* (2006.01)
(Continued)

(52) U.S. Cl.
CPC .... *H01L 21/67115* (2013.01); *H01L 21/0475* (2013.01); *H01L 21/302* (2013.01);
(Continued)

(58) Field of Classification Search
CPC .... B60L 11/005; B60L 2220/54; B60L 50/40; H01L 21/0475; H01L 21/302;
(Continued)

(56) References Cited

U.S. PATENT DOCUMENTS 9,406,504 B2 * 8/2016 Frisina .................. C30B 33/00
9,490,104 B2 * 11/2016 Yokogawa ........ H01J 37/32091
(Continued)

FOREIGN PATENT DOCUMENTS

JP          63-6858 A      1/1988
JP          2-139935 A     5/1990
(Continued)

OTHER PUBLICATIONS

International Search Report dated Dec. 20, 2016, issued in counterpart application No. PCT/JP2016/004505. (2 pages).
(Continued)

*Primary Examiner* — Lan Vinh
(74) *Attorney, Agent, or Firm* — Westerman, Hattori, Daniels & Adrian, LLP

(57) ABSTRACT

A heat treatment container (1) is provided with support members (6) for supporting a disc-shaped SiC substrate (2), which is an object, at a time of an etching treatment of the SiC substrate (2). Each of the support members (6) has an inclined surface (6F) for supporting a lower surface end (2E) of the SiC substrate (2), the inclined surface being inclined so as to increasingly approach the centerline of the SiC substrate (2) going downward. More specifically, each of the support members (6) is formed in a conical shape with a diameter that increases going downward, and a conical surface which is the peripheral surface of each supporting member forms the inclined surface (6F). A vertically-middle section of the inclined surface (6F) contacts the lower surface end (2E) of the SiC substrate (2).

15 Claims, 5 Drawing Sheets

(51) Int. Cl.
  *H01L 21/3065* (2006.01)
  *H01L 21/302* (2006.01)
  *H01L 21/04* (2006.01)
  *H01L 21/687* (2006.01)

(52) U.S. Cl.
  CPC ........ *H01L 21/3065* (2013.01); *H01L 21/683* (2013.01); *H01L 21/6875* (2013.01)

(58) Field of Classification Search
  CPC ........... H01L 21/3065; H01L 21/67115; H01L 21/683; H01L 21/6875; H01L 21/673; H01L 21/68714; H02K 11/22; H02M 2001/0064; H02M 2003/1552; H02M 3/155; H02M 3/158; H02P 2201/09; H02P 25/092; H02P 6/08; H02P 6/14; Y02T 10/641; Y02T 10/642
  USPC ...... 438/714, 715, 718, 719; 117/54, 84, 88, 117/94, 105, 915; 156/345.51, 345.52
  See application file for complete search history.

(56) References Cited

U.S. PATENT DOCUMENTS

2004/0029065 A1    2/2004  Kreiser et al.
2008/0189975 A1*   8/2008  Miya ................ H01L 21/68728
                                                            34/317
2015/0255314 A1*   9/2015  Torimi .................... C30B 29/36
                                                            438/707
2015/0258553 A1    9/2015  Kobayashi et al.
2015/0279708 A1   10/2015  Kobayashi et al.

FOREIGN PATENT DOCUMENTS

| JP | 2003-525524 A | 8/2003 |
| JP | 2006-28625 A | 2/2006 |
| JP | 2008-16691 A | 1/2008 |
| JP | 2014-103180 A | 6/2014 |
| JP | 2015-177109 A | 10/2015 |
| WO | 2005/124840 A1 | 12/2005 |

OTHER PUBLICATIONS

Extended (supplementary) European Search Report dated Feb. 20, 2019, issued in counterpart EP Application No. 16853278.6. (7 pages).

* cited by examiner

HEAT TREATMENT VESSEL FOR SINGLE-CRYSTAL SILICON CARBIDE SUBSTRATE AND ETCHING METHOD

TECHNICAL FIELD

The present invention relates mainly to a heat treatment container used for an etching treatment of a single crystal silicon carbide (SiC) substrate.

BACKGROUND ART

A silicon carbide (SiC) is highly expected as a semiconductor material for next-generation power devices and high-frequency devices that achieves a high-temperature resistance, high frequency resistance, high voltage resistance and high environmental resistance, which cannot be achieved by the existing semiconductor materials such as silicon (Si) or gallium arsenide (GaAs).

Patent Document 1 discloses a heat treatment container used for an etching treatment of this kind of disc-shaped SiC substrate. The heat treatment container has a plurality of spacers between a disc-shaped single crystal SiC substrate and an inner bottom surface of the heat treatment container. The SiC substrate is supported by the spacers. In such configuration, both main surfaces of the SiC substrate (an upper surface and a lower surface, Si-face and C-face) are sufficiently exposed to an internal space of the heat treatment container, and the etching treatment is performed on both of the main surfaces by performing the heat treatment of the SiC substrate under Si vapor pressure.

PRIOR-ART DOCUMENTS

Patent Documents

PATENT DOCUMENTS 1: Japanese Patent Application Laid-Open No. 2008-16691

SUMMARY OF THE INVENTION

Problems to be Solved by the Invention

However, in a configuration of Patent Document 1, the etching treatment is performed in a state where the spacers come in contact with one main surface (a lower surface) of the SiC substrate with a large area, and thereby marks leave on the SiC substrate side. To be specific, relative protrusions are formed on one main surface (the lower surface) of the SiC substrate, due to masking effect. The protrusions may cause deterioration of adhesion to a susceptor and a vacuum chuck failure in a process of an epitaxial layer growth performed for the SiC substrate after the etching treatment, and a plasma dry etching treatment. In a configuration of Patent Document 1, other main surface (that is, an upper surface) opposite to one main surface which comes in contact with the spacers is regarded as a surface to be treated (a surface for mounting the device or the like).

However, when the main surface opposite to the spacers is regarded as the surface to be treated similarly to a configuration of Patent Document 1, there is a problem that dusts and the like are likely to adhere to the surface to be treated and thereby a quality of the SiC substrate is deteriorated.

The present invention is made in view of the circumstances described above, and a potential object of the present invention is to eliminate an influence on the quality of the SiC substrate, the influence caused by marks which are formed on the SiC substrate side by supporting the SiC substrate, and to suppress adhesion of the dusts and the like to the surface to be treated.

Means for Solving the Problems and Effects Thereof

The problem to be solved by the present invention is as described above, and next, means for solving the problem and effects thereof will be described.

According to a first aspect of the present invention, a heat treatment container having the following configuration is provided. That is, the heat treatment container includes supporting members for supporting a disc-shaped SiC substrate as an object during the etching treatment of the SiC substrate. Each of the supporting members has an inclined section for supporting a lower surface end of the SiC substrate. The inclined section inclines so as to approach a centerline of the SiC substrate as going downward.

Accordingly, since the supporting members support the SiC substrate while coming in contact with only the lower surface end of the SiC substrate, marks which are formed on the SiC substrate side when the SiC substrate comes in contact with the supporting members do not leave on regions other than end portions to be excluded in a subsequent process. Therefore, the SiC substrate can be supported such that the surface to be treated faces downward. This can suppress adhesion of dusts to the surface to be treated.

The above-described heat treatment container is preferably configured as follows. That is, the inclined section has a planar surface, a cylindrical surface, a conical surface, or a ridgeline. A vertically-middle section of the inclined section comes in contact with the lower surface end of the SiC substrate.

Accordingly, the SiC substrate as an object can be supported by the supporting members with a stable condition.

The heat treatment container is preferably configured as follows. That is, the heat treatment container further includes a bottom plate for defining a bottom of the heat treatment container. The supporting members are removable from the bottom plate.

Accordingly, for example, the supporting members are removed from the bottom plate and left outside the heat treatment container during a treatment in which Si is applied to the inside of the heat treatment container, which can prevent the surfaces of the supporting members chemically changed with Si application from adhering to the SiC substrate in an etching treatment. Therefore, cracking of the SiC substrate can be prevented.

The heat treatment container is preferably configured as follows. That is, the supporting members are made of tantalum carbide or niobium carbide. An inner bottom surface of the bottom plate and a surface that exposes to an internal space of the heat treatment container are made of tantalum silicide.

Accordingly, while preventing the supporting members from adhering to the SiC substrate, Si atmosphere is effectively provided within the heat treatment container by utilizing the surface that exposes to the inner bottom surface of the bottom plate and the internal space of the heat treatment container as Si supply source, which can perform the etching treatment of the SiC substrate.

The heat treatment container is preferably configured as follows. That is, either one of a shaft-like insertion part or an insertion hole is provided at the lower end of the supporting members. The bottom plate has an insertion hole or an shaft-like insertion part corresponding to either one of the shaft-like insertion part or the insertion hole provided at the lower end of the supporting members.

Accordingly, the shaft-like insertion part is merely inserted in the insertion hole, and thereby the supporting members can be mounted on or removed from the bottom plate. This simplifies the work for mounting and removing the supporting members.

The heat treatment container is preferably configured as follows. That is, the shaft-like insertion part has an external thread. The insertion hole has an internal thread.

Accordingly, the supporting members are merely rotated, and thereby the supporting members can be mounted on or removed from the bottom plate. This simplifies the work for mounting and removing the supporting members.

The heat treatment container is preferably mounted on the bottom plate by using a mounting mechanism having a clearance.

Accordingly, even when a dimension of the bottom plate and the supporting members is changed due to thermal expansion, the supporting members are moved with respect to the bottom plate so as to absorb such difference in dimension, which can suppress stress from being applied to the SiC substrate. This can prevent warping or cracking of the SiC substrate.

The heat treatment container is preferably configured that the supporting members can change inclination of the inclined section by using the clearance.

Accordingly, a position where the SiC substrate comes in contact with the inclined section of the supporting member is vertically changed. Therefore, even when each dimension of the bottom plate and the supporting members is changed due to thermal expansion, the SiC substrate can be supported by the supporting members with a stable condition, without causing warping or cracking of the SiC substrate.

According to a second aspect of the present invention, an etching method for performing an etching treatment for the SiC substrate with the heat treatment container is provided, the etching method in which an end of a surface to be treated is supported by the supporting members in a state where the surface to be treated of the SiC substrate faces downward.

Accordingly, the etching treatment is performed in a state where the SiC substrate is supported such that the surface to be treated faces downward, which can suppress adhesion of the dusts to the surface to be treated.

EMBODIMENT FOR CARRYING OUT THE INVENTION

Figure 1:
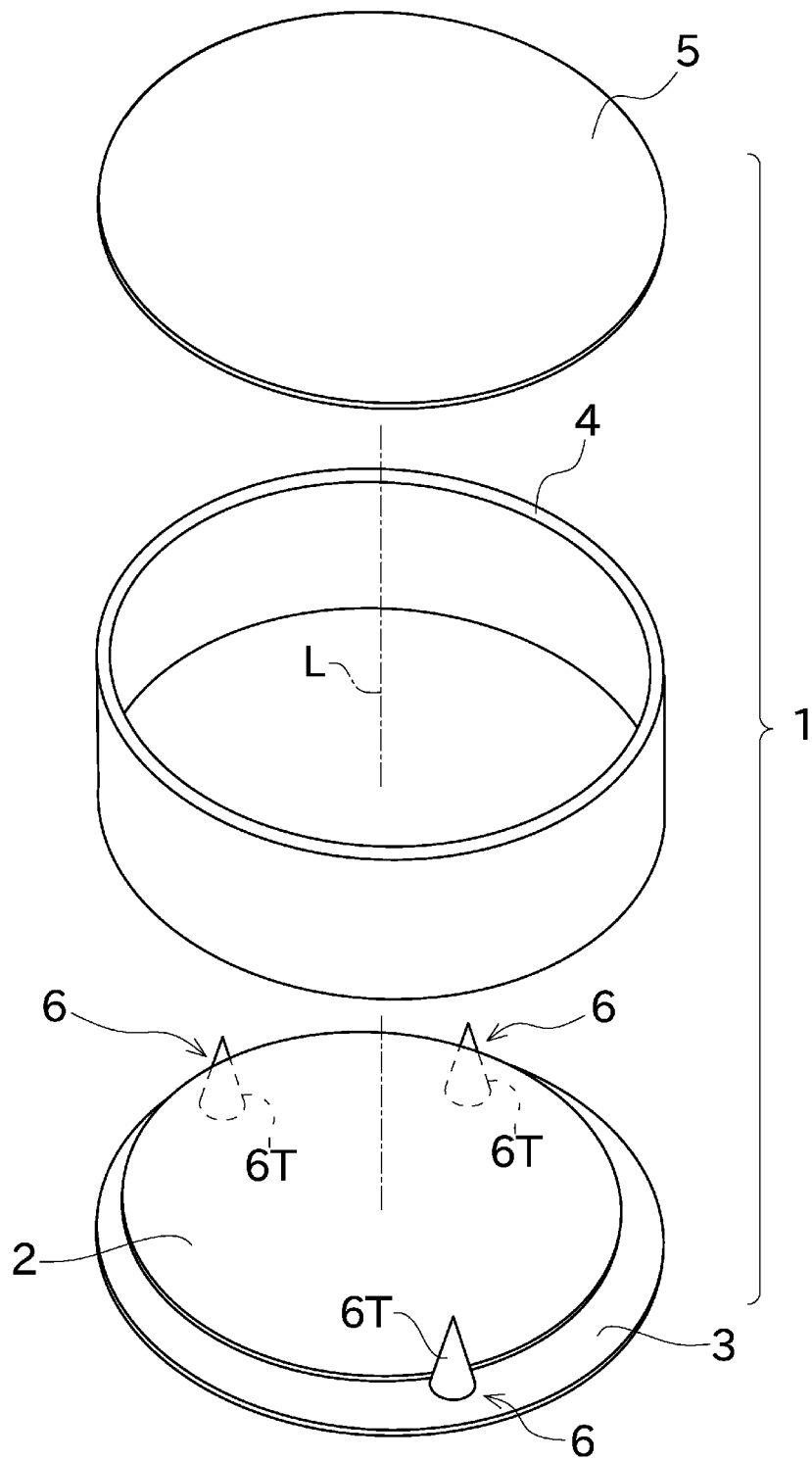
FIG. 1 An exploded perspective view of a heat treatment container according to one embodiment of the present invention.
Figure 2:
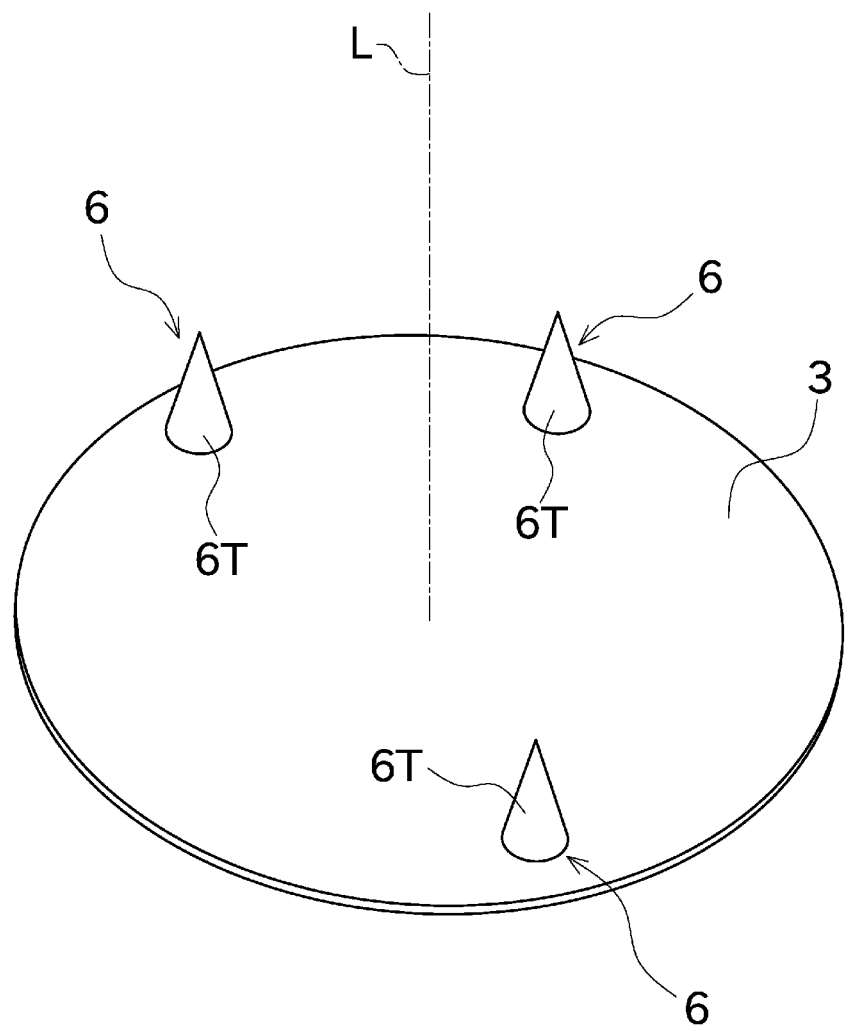
FIG. 2 A perspective view showing a configuration of a bottom plate and supporting members provided in the heat treatment container.
Figure 3:
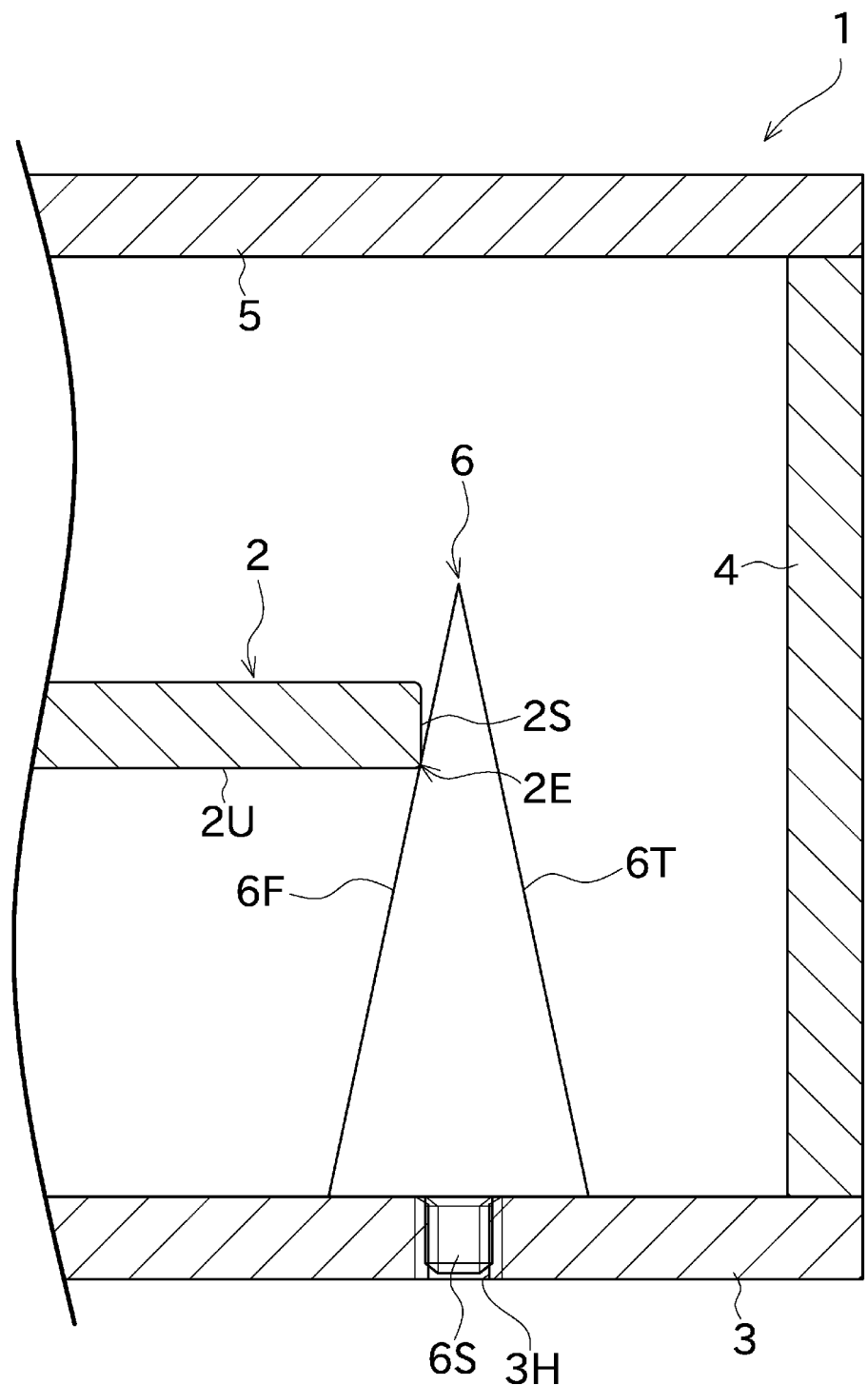
FIG. 3 A side cross-sectional view of the heat treatment container.
Figure 4:
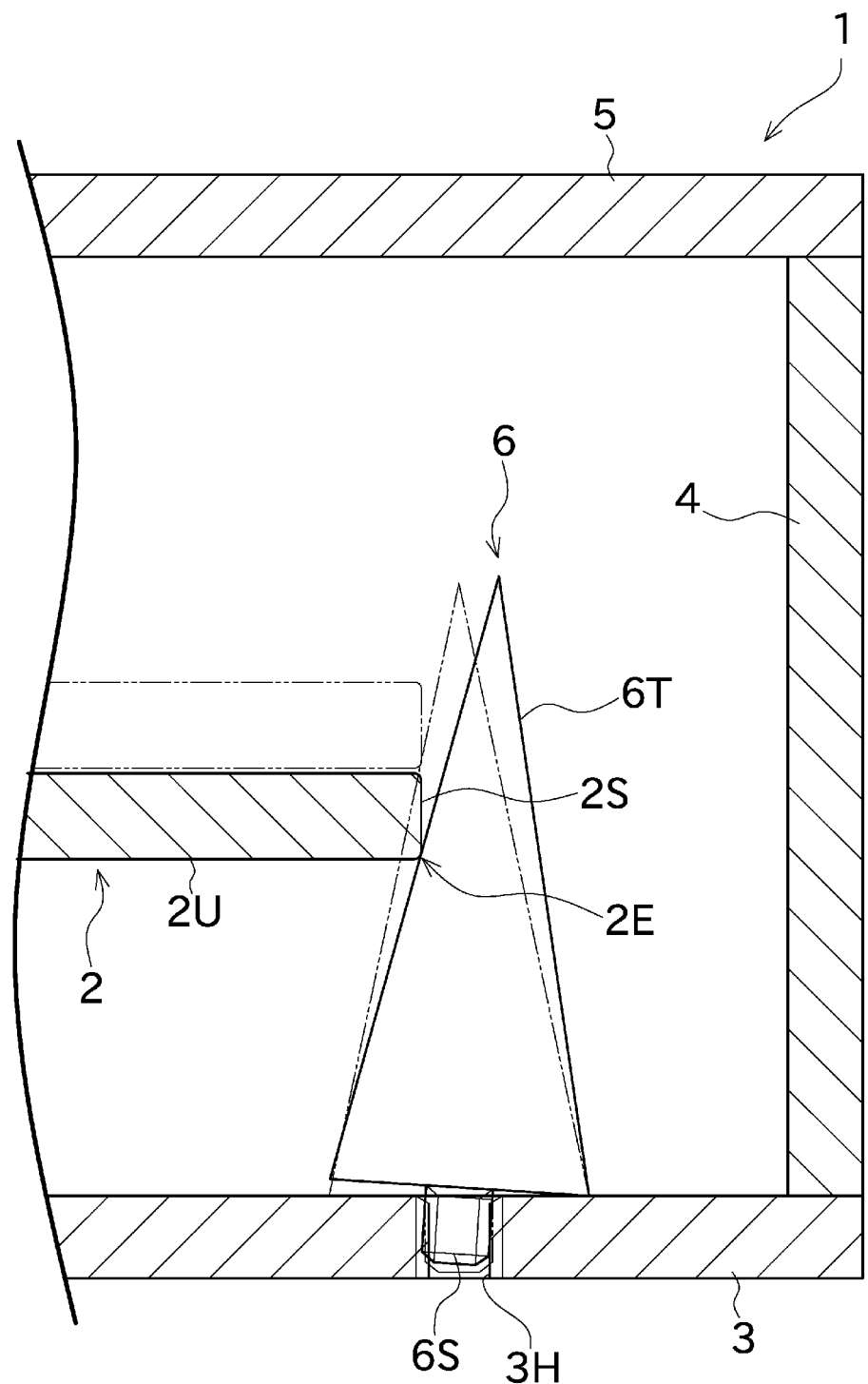
FIG. 4 A side cross-sectional view showing a situation that inclination of an inclined surface one of the supporting members is changed.

Next, an embodiment of the present invention will be described with reference to drawings. FIG. 1 is an exploded perspective view of a heat treatment container 1 according to one embodiment of the present invention. FIG. 2 is a perspective view showing a configuration of a bottom plate 3 and supporting members 6 provided in the heat treatment container 1. FIG. 3 is a side cross-sectional view of the heat treatment container 1. FIG. 4 is a side cross-sectional view showing a situation that inclination of an inclined surface 6F of one of the supporting members 6 is changed.

The heat treatment container 1 having a substantially cylindrical external shape, shown in FIG. 1 and FIG. 3, is used for storing a disc-shaped SiC substrate 2 as an object, in an etching treatment of the SiC substrate 2. The heat treatment container 1 includes a disc-shaped bottom plate 3, a cylindrical-shaped body 4, and a lid 5. The heat treatment container 1 has its internal space with a semi-sealed state, by stacking the bottom plate 3, the body 4 and the lid 5 in a vertical direction as shown in FIG. 1 and FIG. 3.

The SiC substrate 2 stored within the heat treatment container 1 is heat-treated (annealing) in a state where its internal space is filled with Si vapor pressure, in an environment of 1500° C. or more and 2200° C. or less, and desirably 1600° C. or more and 2000° C. or less. Thereby, main surfaces of the SiC substrate 2 can be etched. "Main surfaces" as used herein mean surfaces other than side surfaces of the SiC substrate 2 (a pair of planar main surfaces).

The SiC substrate 2 after the etching treatment is then subjected to treatments such as an epitaxial layer growth and an ion implantation. An activation after the ion implantation leads to a where the main surfaces have sufficient flatness and electrical activity. A region about several mm from an outer periphery of the disc-shaped SiC substrate 2 (for example, a region about 3 mm when the outer diameter of the SiC substrate 2 is 100 mm) is defined as a region to be excluded (edge exclusion). A semiconductor element is manufactured by using a region other than edge exclusion.

Next, a detailed configuration of the heat treatment container 1 will be described with reference to FIG. 1 to FIG. 3. As above, the heat treatment container 1 is a container having a substantially cylindrical external shape. From another point of view, a crucible is formed by combination of the bottom plate 3, the body 4, and the lid 5. The heat treatment container (crucible) 1 that is placed on a support table or the like provided in a heating furnace (not shown) is heated at the above-described temperature.

A tantalum silicide layer ($Ta_5Si_3$) is formed on surfaces in the bottom plate 3, the body 4, and the lid 5, each of the surfaces exposed to an internal space of the heat treatment container 1. A tantalum carbide layer (TaC and $Ta_2C$) is formed just outside the tantalum silicide layer. A tantalum layer (Ta) is formed on the opposite side of the tantalum silicide layer across the tantalum carbide layer.

As shown in FIG. 1 and FIG. 2, a plurality of supporting members 6 is disposed on an upper surface of the bottom plate 3 (that is, an inner bottom surface of the heat treatment container 1). The SiC substrate 2 is supported by the bottom plate 3 via the supporting members 6. In this embodiment, the bottom plate 3 is formed into a disc shape having an outer diameter slightly larger than that of the SiC substrate 2. The SiC substrate 2 is disposed above the bottom plate 3 at a distance from the bottom plate 3 in a state where a center position of the SiC substrate 2 coincides with the center of the bottom plate 3 in a plan view.

The above-described tantalum silicide layer formed on the surface exposed to the internal space of the heat treatment container 1 functions as Si supply source for filling the internal space of the heat treatment container 1 with Si vapor pressure. The melted Si is brought into contact with the surfaces exposed to the internal space of the bottom plate 3, the body 4, and the lid 5 of the heat treatment container 1, and then heated at 1800° C. or more and 2000° C. or less, which can form the tantalum silicide layer. Accordingly, the tantalum silicide layer made of $Ta_5Si_3$ can be achieved. In this embodiment, although the tantalum silicide layer having a thickness of 30 μm or more and 50 μm or less, for example, the thickness of 1 μm or more and 300 μm or less may be adoptable depending on the volume of the internal space and the like.

In this embodiment, although $Ta_5Si_3$ is formed as tantalum silicide, tantalum silicide represented by other chemical formula (for example, $TaSi_2$) may be formed. A plurality of tantalum silicide may be formed in a stacked manner.

As shown in FIG. 2, the plurality of supporting members 6 (in this embodiment, three supporting members 6) is mounted on the bottom plate 3. Each of the supporting members 6 forms a part of the heat treatment container 1. Each of the supporting members 6 is used for supporting the SiC substrate 2, when the etching treatment is performed, at a distance from the bottom plate 3 of the heat treatment container 1. Each of the supporting members 6 is removable from the bottom plate 3.

Each of the supporting members 6 is disposed side by side at regular intervals (in this embodiment, at 120° intervals) on a virtual circle centered on the center of the bottom plate 3 in a plan view, so that the lower surface end of the disc-shaped SiC substrate 2 is supported at a plurality of points. Each of the supporting members 6 has a conical shape, for example. An inclined surface (inclined section) 6F that inclines so as to approach a centerline L (see FIG. 2) of the bottom plate 3 as going downward. That is, each of the supporting members 6 has the inclined surface 6F that inclines so as to become higher as going away from the center of bottom plate 3.

Here, as shown in FIG. 3, a lower end of the supporting member 6 is disposed at a position closer to the centerline L side than the outer periphery of the SiC substrate 2 in a plan view. Therefore, the supporting members 6 can support the SiC substrate 2 on the inclined surface 6F, while coming in contact with a lower surface end 2E of the SiC substrate 2. That is, the supporting members 6 support the lower surface end 2E (a boundary point between a side surface 2S and a lower surface 2U) of the SiC substrate 2.

More specifically, each of the supporting members 6 of this embodiment has a conical shape, and its diameter is larger as going downward. A conical-shaped tapered surface (conical surface) 6T as an outer peripheral surface of each of the supporting members 6 is the inclined surface 6F. Such vertically-middle section comes in contact with the lower surface end 2E of the SiC substrate 2, and thereby the supporting members 6 can support the SiC substrate 2. In this way, each of the supporting members 6 having a conical shape protrudes upward and has a configuration that the SiC substrate 2 is disposed inside the plurality of inclined surfaces 6F (tapered surfaces 6T), and thereby the SiC substrate 2 as the object can be held by the supporting members 6 with a stable condition.

As such, in the heat treatment container 1 according to this embodiment, since the supporting members 6 support the SiC substrate 2 in a state where each of the supporting members 6 comes in contact with only the lower surface end 2E of the SiC substrate 2, marks which are formed on the SiC substrate 2 side due to the etching treatment while contacting the supporting members 6, do not leave on regions other than that near the lower surface end 2E of the SiC substrate 2. Since positions of such marks are included in the region to be excluded of the SiC substrate 2 which is formed during a manufacturing process of the semiconductor element, there is no influence on the quality of the product. As such, unlike the conventional configuration, in the configuration of this embodiment, since large protrusions or the like due to masking effect are not formed on the lower surface of the SiC substrate 2, the SiC substrate 2 can be supported so that the surface to be treated for mounting the device and the like faces downward (in a face down state). As a result, adhesion of dusts and the like to the surface to be treated can be suppressed.

The supporting members 6 are made of tantalum carbide (TaC). As such, among the members that expose to the internal space of the heat treatment container 1, only the supporting members 6 are made of tantalum carbide. The tantalum silicide layer is formed on the surfaces of other members (the surfaces that exposes to the internal space). Such configuration can surely prevent the supporting members 6 turned to tantalum silicide from adhering to the SiC substrate 2. The tantalum silicide layer over a large area exposed to the internal space of the heat treatment container 1 is used as Si supply source, and thereby Si atmosphere can be formed in the internal space of the heat treatment container 1. Therefore, Si concentration in the internal space can be uniform, and the etching treatment can be uniformly performed for the main surfaces of the SiC substrate 2.

Furthermore, during a Si applying treatment (a pre-treatment prior to the etching treatment) by which the melted Si comes in contact with the surface of the internal space of the heat treatment container 1, the supporting members 6 are removed from the bottom plate 3 and left outside the heat treatment container 1, which can prevent silicidation caused by Si adhesion to the surfaces of the supporting members 6. This can surely prevent the supporting members 6 from adhering to the SiC substrate 2 during the etching treatment, and prevent cracking of the SiC substrate 2.

However, materials for forming the supporting members 6 are not limited to the above-described tantalum carbide. Instead of this, the material may be niobium carbide. In this case, silicidation caused by Si adhesion to the surfaces of the supporting members 6 can be prevented, and adhesion of the supporting member 6 and the SiC substrate 2 to each other can be prevented.

Next, a configuration in which the supporting members 6 are removable from the bottom plate 3 will be described in detail with reference to FIG. 3 and FIG. 4. In this embodiment, a shaft 6S having an external thread protrudes downward. The shaft 6S is provided at a lower end of each of the supporting members 6. Holes 3H having an internal thread corresponding to the above-described external thread respectively are arranged side by side at regular intervals (in this embodiment, three holes) along the virtual circle in the bottom plate 3. The shaft 6S of the external thread in the lower end of each of the supporting members 6 is screwed in each of the holes 3H of the internal thread, and thereby the supporting members 6 can be mounted on the bottom plate 3. Each of the supporting members 6 is turned in the direction opposite to the above-described direction, and thereby the supporting members 6 can be removed from the bottom plate 3. As such, each of the supporting members 6 is merely turned, and thereby the supporting member 6 can be mounted on or removed from the bottom plate 3. This can simplify a mounting and removal work.

Here, a dimension of each hole 3H of the internal thread provided in the bottom plate 3 has an appropriate clearance (play) with respect to the shaft 6S of the external thread.

Therefore, the shaft 6S at the lower end of each of the supporting members 6 is mounted to the bottom plate 3 while having the clearance (play) with respect to the bottom plate 3.

Thanks to a screw mechanism (a mounting mechanism) having such clearance, even when each dimension of the SiC substrate 2, the bottom plate 3 and the supporting members 6 is changed by thermal expansion due to the heat treatment and the like, each of the supporting members 6 moves with respect to the bottom plate 3 so as to absorb such change. Therefore, stress can be suppressed from being applied to the SiC substrate 2. Accordingly, warping or cracking of the SiC substrate 2 along with thermal expansion can be prevented.

As shown in FIG. 4, each of the supporting members 6 is totally inclined by moving for the distance corresponding to the clearance with respect to the shaft 6S of hole 3H of the internal thread. This can change the inclination of the inclined surface 6F. Accordingly, even when each dimension of the bottom plate 3 and the supporting members 6 is changed due to thermal expansion, the inclination of the inclined surface 6F can be changed without warping or cracking of the SiC substrate 2.

Figure 5:
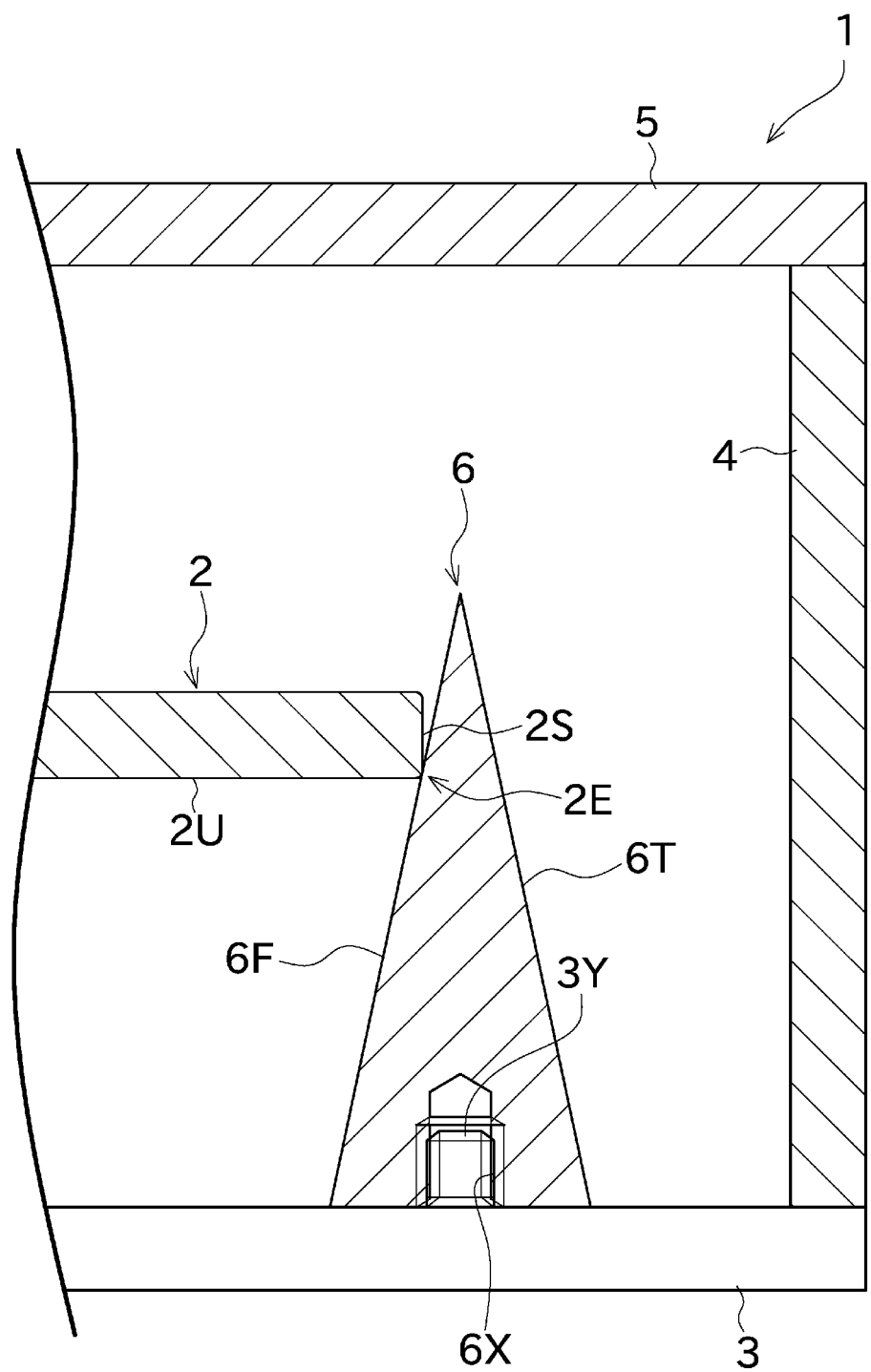
FIG. 5 A side cross-sectional view of the heat treatment container according to other embodiment of the present invention.

In order to make the supporting members 6 removable from the bottom plate 3, instead of the above-described configuration, a configuration shown in FIG. 5 may be adoptable. FIG. 5 is a side cross-sectional view of a heat treatment container according to other embodiment of the present invention.

In the configuration of FIG. 5, a hole 6X of the internal thread is provided at a lower end of each of the supporting members 6. A shaft 3Y having the external thread corresponding to the internal thread is provided side by side at regular intervals (in this embodiment, three shafts) along the virtual circle in the bottom plate 3. As such, a configuration in which each of the supporting members 6 has the internal thread, and the bottom plate 3 has the external thread may be adoptable.

As described above, the heat treatment container 1 of this embodiment includes the supporting members 6 for supporting the disc-shaped SiC substrate 2 as the object during the etching treatment of the SiC substrate 2. Each of the supporting members 6 has the inclined surface 6F that inclines so as to approach the centerline L of the bottom plate 3 as going downward.

Accordingly, since the supporting members 6 support the SiC substrate 2 while contacting only the lower surface end 2E of the SiC substrate 2, marks which are formed on the SiC substrate 2 side when the SiC substrate 2 comes in contact with the supporting members 6, do not leave on regions other than end portions to be excluded (regions to be excluded) in subsequent processes. Therefore, the SiC substrate 2 can be supported such that the surface to be treated faces downward. This can suppress adhesion of dusts to the surface to be treated.

In the heat treatment container 1 of this embodiment, the inclined surface 6F is formed into a conical surface (tapered surface 6T). The vertically-middle section of the inclined surface 6F comes in contact with the lower surface end 2E of the SiC substrate 2.

Accordingly, the SiC substrate 2 as the object can be held by the supporting members 6 with a stable condition.

The heat treatment container 1 of this embodiment further includes the bottom plate 3 that forms a bottom of the heat treatment container 1. The supporting members 6 are removable from the bottom plate 3.

Accordingly, during a treatment in which Si is applied to the inside of the heat treatment container 1, the supporting members 6 are removed from the bottom plate 3 and left outside the heat treatment container 1, which can prevent the surfaces of the supporting members 6 turned to tantalum silicide (silicidation) from adhering to the SiC substrate 2 in the etching treatment. Therefore, cracking of the SiC substrate 2 can be prevented.

In the above-described heat treatment container 1, the supporting members 6 are made of tantalum carbide or niobium carbide. The inner bottom surface of the bottom plate 3 and surfaces that expose to the internal space of the heat treatment container 1 are made of tantalum silicide.

Accordingly, while preventing the supporting members 6 from adhering to the SiC substrate 2, Si atmosphere is effectively provided within the heat treatment container 1 by utilizing the surfaces that expose to the internal space of the heat treatment container 1 as Si supply source, which can perform the etching treatment of the SiC substrate 2.

In the above-described heat treatment container 1, the shaft-like insertion part (shaft 6S) is provided at the lower end of each of the supporting members 6, and the insertion hole (hole 3H) corresponding to the above-described shaft 6S is provided on the bottom plate 3. In other embodiment, the insertion hole (hole 6X) is provided at the lower end of each of the supporting members 6, and the shaft-like insertion part (shaft 3Y) corresponding to the above-described hole 6X is provided on the bottom plate 3.

Accordingly, the shaft 6S is merely inserted in the hole 3H (or the shaft 3Y is merely inserted in the hole 6X), the supporting members 6 can be mounted on or removed from the bottom plate 3. This can simplify a mounting and removal work.

In the above-described heat treatment container 1, the external thread is provided in the shaft 6S and the shaft 3Y. The internal thread is provided in the hole 3H and the hole 6X.

Accordingly, each of the supporting members 6 is merely turned, and thereby the supporting members 6 can be mounted on or removed from the bottom plate 3. This can simplify a mounting and removal work of the supporting members 6.

In the above-described heat treatment container 1, each of the supporting members 6 is mounted on the bottom plate 3 via a screw mechanism having the clearance (play).

Accordingly, even when each dimension of the bottom plate 3 and the supporting members 6 is changed due to thermal expansion, the supporting members 6 are moved with respect to the bottom plate 3 so as to absorb such difference in dimension, which can suppress stress from being applied to the SiC substrate 2. This can prevent warping or cracking of the SiC substrate 2.

In the above-described heat treatment container 1, the supporting members 6 can change inclination of the inclined surface 6F by using the clearance.

Accordingly, a position where the SiC substrate 2 comes in contact with the inclined surface 6F of the supporting members 6 is vertically changed. Therefore, even when each dimension of the bottom plate 3 and the supporting members 6 is changed due to thermal expansion, the SiC substrate 2 can be supported by the supporting members 6 with a stable condition, without causing warping or cracking of the SiC substrate 2.

In this embodiment, with the heat treatment container 1, in a state where the surface to be treated of the SiC substrate 2 faces downward, the etching treatment is performed to the SiC substrate 2 in which the end 2E of the surface to be treated (the lower surface 2U) is supported by the supporting members 6.

Accordingly, the etching treatment is performed in a state where the SiC substrate 2 is supported such that the surface to be treated faces downward (in a face down state), which can suppress adhesion of the dusts to the surface to be treated.

Although a preferred embodiment of the present invention has been described above, the above-described configuration can be modified, for example, as follows.

In the above-described embodiment, although each of the supporting members 6 has a conical shape, a shape of each of the supporting members 6 is not limited to the conical shape. That is, as long as each of the supporting members may have an inclined section that inclines so as to approach the centerline of the SiC substrate as going downward, each of the supporting members may be formed by a thin cylindrical wire inclined appropriately with respect to the vertical direction, a flat plate member or the like. Each of the supporting members may be formed by an inclined rod-shaped member, and its circumferential surface of the cylindrical surface may support the SiC substrate. Alternatively, each of the supporting members may have the shape combined a conical-shaped upper portion having a tapered surface and a cylindrical-shaped lower portion. The shape of each supporting member may be a polygonal pyramid such as a triangular pyramid, a hexagonal pyramid or a pyramidal pyramid, for example. In this case, the SiC substrate may be supported on an inclined plane of the polygonal pyramid, or the SiC substrate may be supported on a ridgeline section (a knife edge section).

In the above-described embodiment, each of the supporting members 6 is slightly moved by the clearance (play) between the shaft 6S of the external thread provided in the lower end of the supporting members 6 and the hole 3H of the internal thread provided in the bottom plate 3. However, a form of the clearance is not limited to the above-described configuration. That is, alternatively, a removable mounting mechanism (a dowel mechanism) including a screwless shaft-like insertion part and an insertion hole is provided, and the clearance can be provided between the shaft-like insertion part and the insertion hole. Grooves extending in a radial direction with respect to the centerline L of the SiC substrate 2 are provided in the bottom plate 3, so that the supporting members can slide within the grooves. Alternatively, the supporting members can be configured to move with respect to the bottom plate by using a rotating shaft, a cam mechanism, etc.

In the above-described embodiment, although three supporting members 6 are provided at regular intervals in a position corresponding to the outer periphery of the SiC substrate 2 in a plan view on the bottom plate 3, the number of supporting members 6 is not limited to this. For example, four or more supporting members 6 may be provided. The supporting members 6 may be disposed at irregular intervals.

The configuration of the supporting members 6 are not limited to the configuration in which they protrude to the bottom plate 3. The supporting members 6 may be provided in the body 4 or the lid 5. The supporting members 6 may be unremovable from the bottom plate 3 or the like.

In the above-described embodiment, although the body 4 and the bottom plate 3 can be separated from each other, the body 4 and the bottom plate 3 may be integrally formed with each other.

The SiC substrate 2 may be supported by the supporting members 6 in a state where the surface for mounting the device and the like (the surface to be treated) faces upward.

In the above-described embodiment, although the supporting members 6 are mounted directly to the bottom plate 3 via the screw, this is not limiting. Alternatively, for example, a pedestal may be provided on the inner bottom surface of the bottom plate 3, and then the supporting members may be indirectly to the bottom plate via the pedestal. In this case, a screw hole may be provided in the pedestal.

DESCRIPTION OF THE REFERENCE NUMERALS 1 heat treatment container
2 SiC substrate
2E lower surface end (of a SiC substrate)
3 bottom plate
3H hole
6 supporting member
6F inclined surface (inclined section)
6S shaft
6T tapered surface

The invention claimed is:

1. A heat treatment container, comprising:
supporting members for supporting a disc-shaped SiC substrate as an object during an etching treatment of the SiC substrate, and
wherein each of the supporting members includes an inclined section for supporting a boundary point between a side surface and a lower surface end of the SiC substrate,
wherein the inclined section inclines so as to be closer to a centerline of the SiC substrate as the inclined section approaches a bottom plate,
wherein each of the supporting members is mounted on the bottom plate via a mounting mechanism having a clearance, and
wherein each of the supporting members is configured such that inclination of the inclined section can be changed by the clearance.

2. The heat treatment container according to claim 1, wherein the inclined section has a planar surface, a cylindrical surface, a conical surface, or a ridgeline, and
wherein a vertically-middle section of the inclined section comes in contact with the lower surface end of the SiC substrate.

3. An etching method, wherein
the etching treatment using the heat treatment container according to claim 1 is performed to the SiC substrate in which an end of a surface to be treated is supported by the supporting members in a state where the surface to be treated of the SiC substrate faces downward.

4. The heat treatment container according to claim 1, further comprising:
a bottom plate that forms a bottom of the heat treatment container,
wherein each of the supporting members is removably provided on the bottom plate.

5. The heat treatment container according to claim 4, wherein each of the supporting members is made of tantalum carbide or niobium carbide, and
wherein an inner bottom surface of the bottom plate and a surface that is exposed to an internal space of the heat treatment container are made of tantalum silicide.

6. The heat treatment container according to claim 4,
wherein either one of a shaft-like insertion part or an insertion hole is provided at a lower end of each of the supporting members, and
wherein the bottom plate has an insertion hole or a shaft-like insertion part corresponding to either one of the shaft-like insertion hole or the insertion hole that is provided at the lower end of each of the supporting members.

7. The heat treatment container according to claim 6,
wherein an external thread is provided in the shaft-like insertion part, and
wherein an internal thread is provided in the insertion hole.

8. A heat treatment container, comprising:
supporting members capable of supporting a disc-shaped SiC substrate as an object during an etching treatment of the SiC substrate, and
a bottom plate that forms a bottom of the heat treatment container,
wherein each of the supporting members includes an inclined section capable of supporting a lower surface end of the SiC substrate, and
wherein the inclined section inclines so as to be closer to a centerline of the SiC substrate as the inclined section approaches the bottom plate, and
wherein each of the supporting members is mounted on the bottom plate via a mounting mechanism having play, such that the supporting members are tiltable relative to the bottom plate.

9. The heat treatment container according to claim 8,
wherein the inclined section has a planar surface, a cylindrical surface, a conical surface, or a ridgeline, and
wherein the heat treatment container is configured such that a vertically-middle section of the inclined section can come in contact with the lower surface end of the SiC substrate.

10. The heat treatment container according to claim 8, wherein each of the supporting members is removably provided on the bottom plate.

11. The heat treatment container according to claim 8,
wherein each of the supporting members is made of tantalum carbide or niobium carbide, and
wherein an inner bottom surface of the bottom plate and a surface that is exposed to an internal space of the heat treatment container are made of tantalum silicide.

12. The heat treatment container according to claim 8,
wherein the mounting mechanism comprises
(i) a shaft-like insertion part provided at a lower end of a least one of the supporting members and a corresponding insertion hole provided in the bottom plate, or
(ii) an insertion hole provided at a lower end of at least one of the supporting members and a corresponding shaft-like insertion part provided on the bottom plate.

13. The heat treatment container according to claim 12,
wherein an external thread is provided in the shaft-like insertion part, and
wherein an internal thread is provided in the insertion hole.

14. The heat treatment container according to claim 8, wherein
each of the supporting members is configured such that inclination of the inclined section can be changed by the play.

15. An etching method, comprising:
etching a disc-shaped SiC substrate in a heat treatment container, the heat treatment container comprising supporting members capable of supporting the SiC substrate, the supporting members having an inclined section that inclines so as to be closer to a centerline of the SiC substrate as the inclined portion approaches a bottom thereof, and
wherein, during etching, an end of a surface of the SiC substrate to be treated is supported by the inclined section of supporting members in a state where the surface to be treated of the SiC substrate faces downward,
wherein each of the supporting members is mounted on the bottom plate via a mounting mechanism having a clearance, and
wherein each of the supporting members is configured such that inclination of the inclined section can be changed by the clearance.

* * * * *